United States Patent [19]
Hennig

[11] Patent Number: 5,093,619
[45] Date of Patent: Mar. 3, 1992

[54] METHOD FOR THE SIMULTANEOUS MEASUREMENT OF NMR SIGNALS, IN PARTICULAR FOR DETERMINING FLOW RATES IN NUCLEAR SPIN TOMOGRAPHY BY MEANS OF THE MULTIPLE SLICE FOURIER FLOW (MUFF) METHOD

[75] Inventor: Jürgen Hennig, Freiburg, Fed. Rep. of Germany

[73] Assignee: Spectrospin AG, Switzerland

[21] Appl. No.: 564,444

[22] Filed: Aug. 7, 1990

[30] Foreign Application Priority Data

Aug. 16, 1989 [DE] Fed. Rep. of Germany ....... 3926889

[51] Int. Cl.$^5$ ............................................. G01R 33/20
[52] U.S. Cl. .................... 324/306; 324/309
[58] Field of Search ............. 324/300, 307, 309, 318, 324/322; 128/653 A, 653 AF, 653 SC

[56] References Cited

U.S. PATENT DOCUMENTS

| | | |
|---|---|---|
| 4,115,730 | 9/1978 | Mansfield et al. ................. 324/309 |
| 4,318,044 | 3/1982 | Mansfield ........................... 324/309 |
| 4,484,138 | 11/1984 | Bottomley et al. ................. 324/309 |
| 4,843,322 | 6/1989 | Glover . |

FOREIGN PATENT DOCUMENTS

| | | |
|---|---|---|
| 0112663 | 11/1983 | European Pat. Off. . |
| 0234526 | 2/1987 | European Pat. Off. . |
| 3627750 | 8/1986 | Fed. Rep. of Germany . |
| 3726932 | 8/1987 | Fed. Rep. of Germany . |
| 3804446 | 2/1988 | Fed. Rep. of Germany . |
| 3902490 | 1/1989 | Fed. Rep. of Germany . |

Primary Examiner—Michael J. Tokar
Attorney, Agent, or Firm—Walter A. Hackler

[57] ABSTRACT

In a method for the simultaneous measurement of spin resonance signals, in particular NMR signals, from layers located at different depths in a test volume, simultaneous excitation of the different layers is effected by a multiple-component rf excitation pulse $P_n$, consisting of n individual components $P_m$ with the frequencies $\omega_m$, which act selectively on defined layers m of the test volume, in the presence of a layer-selective gradient, the individual components $P_m$ having a phase displacement $\phi_m$ which is varied from one sequence to the next by successive addition of a constant phase increment $\Delta\phi_m$ modulo 360 fixed individually for each individual component $P_m$. If phase coding is effected according to the "Fast Fourier Flow Technique" with the aid of a bipolar gradient pulse, then the flow velocity of a medium moving through the test volume can be measured directly in a multi-dimensional Fourier transformation experiment, simultaneous for several flow cross-sections, in a single recording cycle.

10 Claims, 3 Drawing Sheets

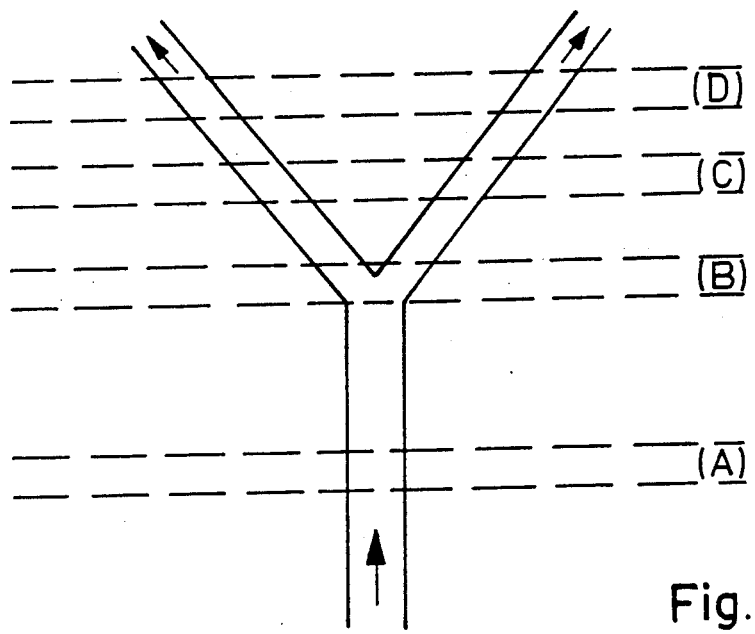
Fig. 2a
Fig. 2b
 (D)   Fig. 2c
 (C)
 (B)
 (A)

METHOD FOR THE SIMULTANEOUS MEASUREMENT OF NMR SIGNALS, IN PARTICULAR FOR DETERMINING FLOW RATES IN NUCLEAR SPIN TOMOGRAPHY BY MEANS OF THE MULTIPLE SLICE FOURIER FLOW (MUFF) METHOD

BACKGROUND OF THE INVENTION

The present invention relates to a method for the simultaneous measurement of spin resonance signals, in particular NMR signals from layers located at different depths in a test volume which is subjected to a homogeneous magnetic field in the Z direction and to successive sequences of pulse-shaped gradient fields as well as to multiple-component rf excitation pulses $P_n$ that are synchronized in time with the said gradient fields and whose n components $P_m$ excite, due to their respective frequency $\omega_m$, a spin resonance of the Larmor frequency $\omega_m$ in a defined layer m of the test volume, a variation in space of the Larmor frequency $\omega_m$ being effected in the Z direction by application of a layer-selective gradient and a read gradient being applied in a direction perpendicular to the Z direction at least for the time of appearance of the spin echo signal.

Methods of this type have been known before from nuclear spin tomography, in particular in connection with the two or three-dimensional imaging techniques. If it is desired to produce a three-dimensional image of certain physical properties of a sample, such as the spin density or flow rate, using 3DFT techniques, this can be achieved only by measuring successively a great number of successive two-dimensional segments of the test volume, a process which is extremely time-consuming and, consequently, rather unsuitable for recording transient processes of the type typically encountered in flow measurements. Although there have been known 3DFT methods where a plurality of disk-like layers of the test volume are subjected to simultaneous spin excitation through a multiple-component excitation pulse, it is a requirement in this case that the individual test volume layers under examination must succeed each other coherently so that it is not possible to eliminate such spatial areas in the volume observed which are of no interest for the observer.

From U.S. Pat. No. 4,843,322 it has been known that a multiple-component excitation pulse may contain terms which are modulated by a $K_y$-dependent phase factor that makes the images obtained from the different excited layers distinguishable during reconstruction thereof. However, the publication does not contain concrete rules as to how the different layers are to be measured, nor does it suggest an algorithm for the phase displacement.

SUMMARY OF THE INVENTION

Now, it is the object of the present invention to provide a method according to the preamble of the main claim which permits the magnetic resonance signals of parallel individual layers at arbitrary points of the test object to be measured simultaneously. This object is achieved by the fact that the individual components $P_m$ of the multiple-component rf excitation pulse $P_n$ are dephased relative to each other by a phase displacement $\phi_m$ which is varied from one sequence to the next by successive addition of a constant phase increment $\Delta\phi_m$ modulo 360° fixed individually for each individual component $P_m$, and that a complete measuring cycle consists of n or an integral multiple of n sequences the measuring results of which are subjected to Fourier transformation.

By correlating the individual phase displacement $\phi_m$ of an individual component $P_m$ of the rf excitation pulse $P_n$ with the layer m excited by that individual component $P_m$ it is possible, after Fourier transformation and for the purpose of displaying the measuring results, to split up the total signal subsequently into the signals received from the individual layers m. Another advantage of the method resides in the fact that for the purpose of displaying the results, the signals received from the individual layers can be combined in any desired order.

According to a preferred embodiment of the method according to the invention, flow rates of a medium flowing through the test volume are measured in a layer-selective manner by means of a bipolar phase-coding gradient according to the Fourier Flow Method. This permits a plurality of flow cross-sections to be measured simultaneously during a single measuring cycle.

According to a further embodiment of the method according to the invention, the qualitative three-dimensional representation of the volumes passed by the flowing medium can be achieved by combining a plurality of flow profiles recorded. This permits, in particular in medical applications, the respective vessels passed by the flowing medium to be reconstructed in a three-dimensional manner (MR angiogram).

It may be of advantage in this connection if the gradient sequence develops in synchronism with the ECG cycle in the so-called cine mode. This permits motion artifacts caused by the pulsating heart to be reduced during heart measurements.

Another embodiment of the method according to the invention provides that the gradient scheme according to the Fourier Flow Principle is replaced by a phase-coding scheme according to a 2DFT imaging experiment (gradient echo or spin echo 2DFT method), and in the case of the spin-echo method the observation window of each layer is restricted by an excitation or refocusing pulse which is disk-selective in the direction of the phase gradient.

This permits a plurality of disks to be imaged simultaneously, the images of the individual disks appearing one beside the other.

With respect to this embodiment of the invention, too, it may be of advantage to use the ECG-triggered recording mode in order to reduce the effect of motion artifacts during heart examinations.

According to another embodiment of the invention, the phase coding for the 2DFT image reconstruction is effected exclusively through phase modulation of the pulses, whereby the observation window of the pulse sequence employed is restricted in phase direction so that an image will be generated only of the relevant area of each disk.

The invention will now be described and explained in more detail by way of certain embodiments illustrated in the drawing. The features that can be derived from the description and the drawing may be used in other embodiments of the invention either individually or in any combination thereof.

BRIEF DESCRIPTION OF THE DRAWINGS

FIG. 2a shows the diagrammatic test set-up of a multiple-slice experiment using an Y-shaped tube;

FIG. 2b shows the measuring result of a Fourier flow experiment obtained with the test set-up illustrated in FIG. 2a;

FIG. 2c shows the measuring result of a MUFF experiment obtained with the test set-up illustrated in FIG. 2a;

FIG. 3b shows an MR angiogram reconstructed from the results of FIG. 3a.

DETAILED DESCRIPTION OF THE PREFERRED EMBODIMENTS

Figure 1:
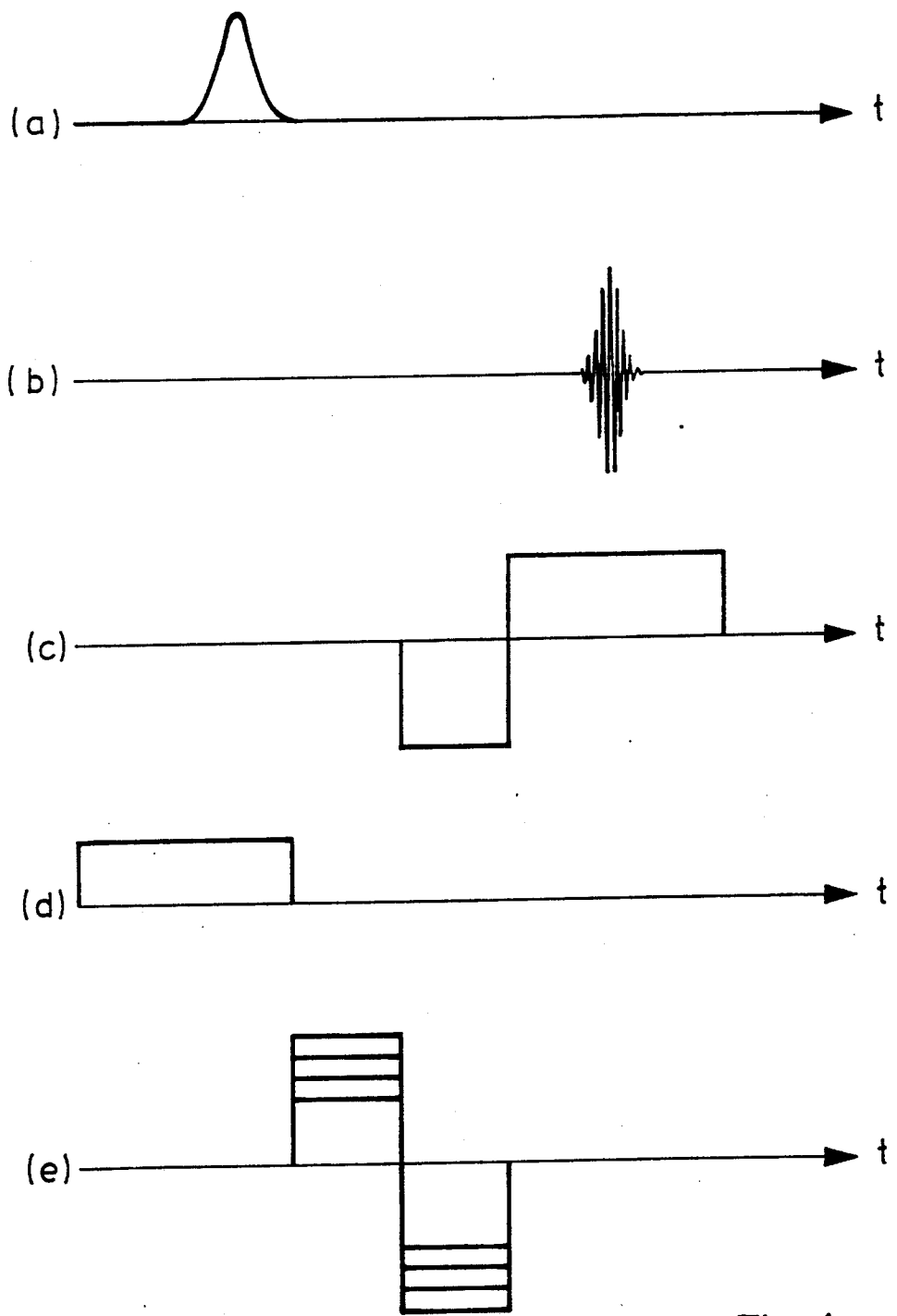
FIG. 1 shows the time diagram of the recording sequence of one embodiment of the method according to the invention, using bipolar phase coding gradients.

The diagram illustrated in FIG. 1 shows the order in time of the pulse sequence according to one embodiment of the method according to the invention, using a pulse sequence known from the Fast Fourier Flow Technique, where the flow velocity is determined directly in a multi-dimensional Fourier transformation experiment, by a phase-coding scheme using a bipolar gradient pulse. The method used is a NMR method where a test volume is subjected to a homogeneous magnetic field in the Z direction applied during the whole measurement, and to the pulse-shaped gradient fields illustrated diagrammatically in FIG. 1 during periodically successive sequences, as well to multiple-component rf excitation pulses $P_n$ which are synchronized in time with the said gradient fields. The excitation pulse $P_n$ is obtained by superposition of n individual components $P_m$.

The excitation profile of each individual component $P_m$ can be described as:

$$P_m = S(m) \cdot \exp(i \cdot \omega_m (t - t_o)), \quad (1)$$

where S(m) is the envelop of the pulse, which may correspond to a Gaussian function, a sinx/x function, a Hermite function, etc., according to the state of the prior art, $\omega_m$ is the Larmor frequency at which resonant excitation occurs in a layer m, while t defines the time constant and $t_o$ defines the moment at the center of the pulse.

Consequently, a multiple-component excitation pulse $P_n$ represented by line (a) and described by $$P_n = \sum_{m=1}^{n} S(m) \cdot \exp(i \cdot \omega_m \cdot (t - t_o)), \quad (2)$$

where all $\omega_m$ differ to an extent that the excitation band width of the individual components defined by the modulation function will not overlap, will lead to the simultaneous excitation of n profiles when the layer-selective gradient represented in line (d) causes the effective magnetic field acting on the test volume to be varied in a defined manner and, accordingly, the Larmor frequency to be varied correspondingly in the Z direction.

Thereafter, the flow velocity of a medium flowing through the test volume is determined simultaneously for all n excited layers, according to the "Fast Fourier Flow Technique", by phase coding using the bipolar flow-coding gradient illustrated in line (e). The resulting spin echo signal is illustrated in line (b) of FIG. 1, while the read gradient is illustrated in line (c).

FIG. 2a is a diagrammatic representation of a simple test set-up using an Y-shaped tube through which water flows in the direction of the arrows. The location of the excited layers is indicated by (A), (B), (C) and (D).

When the measuring results are read out in accordance with the diagram of FIG. 1, one then obtains, as the result of the experiment, the superposition of all excited flow profiles illustrated in FIG. 2b.

However, such a representation is not convenient in practice as all information as to which profile corresponds to which cross-section is lost in this case.

Instead, it would be by far more convenient to have the individual profiles appear separately in the image.

The decisive step required for this purpose, and underlying the present invention, consists in modulating the phase of the individual pulses in such a way that the desired separation of the profiles is obtained after Fourier transformation.

It is, therefore, necessary to supplement equation (2) by an additional term which corresponds to the phase modulation of each individual pulse:

$$P_n = \sum_{m=1}^{n} S(m) \cdot \exp(i \cdot \omega_m \cdot (t - t_o) + \phi_m). \quad (3)$$

The phase displacement $\phi_m$ is varied from one excitation to the next so that the phase of each pulse is incremented by a constant phase increment $\Delta\phi_m$. If in a case where two pulses of different frequency are superimposed the phase of the first pulse portion is left constant, while the phase of that pulse portion which excites the second layer is alternated, the profile of the second layer will appear displaced by half the width of the image according to the sampling theorem of the Fourier transformation.

If four layer profiles are to appear each shifted in the phase direction by ¼ of the size of the image (FIG. 2c), one obtains the following phase cycle for the superposition of the four layer profiles:

| Pulse No. | p1 | p2 | p3 | p4 |
|---|---|---|---|---|
| 1 | 0 | 0 | 0 | 0 |
| 2 | 0 | 90 | 180 | 270 |
| 3 | 0 | 180 | 0 | 180 |
| 4 | 0 | 270 | 180 | 90 |

The above phase angles are denominated in degrees. For an arbitrary number n of excited pulses, the phase increments for the respective pulse portions are, therefore, defined by the formula $$\Delta\phi m = 0, 360°/n, 2 \cdot 360°/n, 3 \cdot 360°/n, \ldots, (n-1) \cdot 360°/n$$

The phase cycle is repeated cyclically until all phase-coding steps (128 or 256) needed for two-dimensional Fourier transformation have been processed. During this process, the bipolar gradient is continuously switched between one excitation and the next so that all n profiles are obtained simultaneously, without any extension of the recording time. A particularly convenient embodiment of the excitation sequence according to the invention generates the n different excitation pulses required for the simultaneous recording of n flow profiles digitally as n different amplitude- and phase-modulated pulses according to equation (3). Although the analog generation of the pulse profiles, obtained by mixing the individual pulses electronically, would be simpler theoretically, the electronic installations required for this purpose would be much more complex as in this case n amplitude- and phase-modulated pulses would be required for pulse generation, while the digital solution permits the total profile to be generated in a single channel.

As the appearance of the individual profiles in the image depends exclusively on the phase modulation $\Delta\phi_m$ of the individual pulses, not on the excitation frequency $\omega_m$ and, thus, on the location of the disks in space, the individual profiles can be arranged in the image arbitrarily, without regard to their position in space. So, it is absolutely possible that profiles having different distances may appear as equidistant in the image. Even the order of the disks may be changed in the image by corresponding selection of $\Delta\phi_m$ if this should be deemed convenient.

Figure 3A:
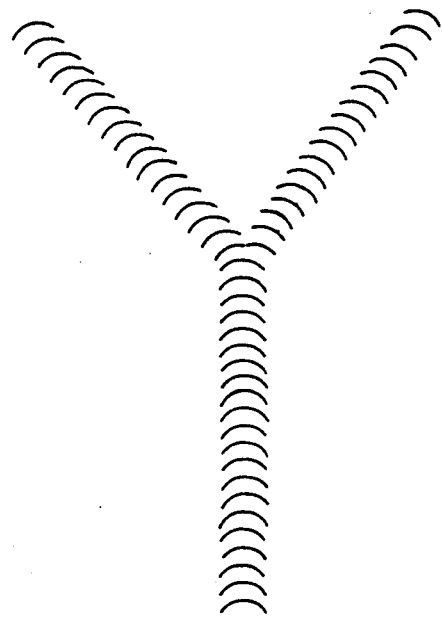
FIG. 3a shows the measuring results of a Muff experiment obtained with the test set-up illustrated in FIG. 2a, with a great number of excited profiles.
Figure 3:
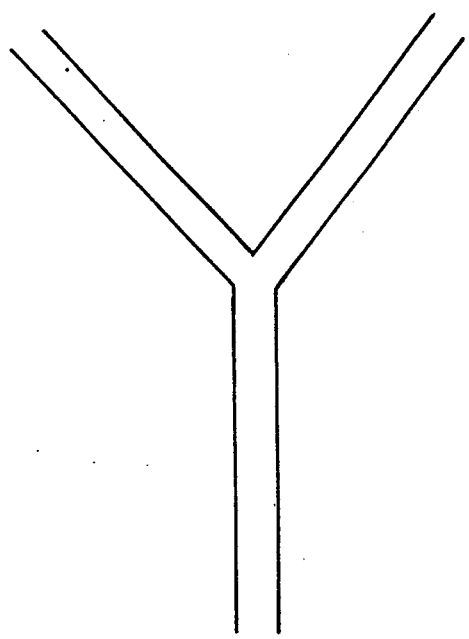

The basic idea of achieving the coding of the phases of profiles via the phase of multi-disk-selective pulses, rather than through a phase-coding gradient, can be used to advantage in other embodiments of the invention:

While applying the before-described basic pulse scheme of a Fast Fourier Flow Sequence, it is possible to realize a variant of the method where the thickness of the excited disks amounts to a few mm only, the position of the profiles defined by the respective phase increment $\Delta\phi_m$ corresponds to the location in space in the body, the velocity sensitivity of the sequence, which is determined by the bipolar gradient, is selected in such a way that the profiles do not overlap at all or at least not in a disturbing way. If these conditions are observed, the flow profiles obtained can then be combined in such a way, as illustrated in FIG. 3a, that a reconstructional representation of the shape of the vessel becomes possible (FIG. 3b) in addition to the measurement of the flow velocity. The described methods can further be modified in such a way that the sequence develops in synchronism with the ECG cycle in the so-called cine mode in a manner such that a plurality (typically 20) successive momentary flow profiles are measured which makes it possible to measure the variation of the flow velocity in arteries over the ECG cycle.

Phase coding by a consecutive increase of the phase of the pulse portions can be used also for pure imaging. If a phase coding process corresponding to a 2DFT imaging experiment is employed, instead of a gradient switching scheme according to the Fourier Flow Principle, then a plurality of disks can be imaged simultaneously with the images of the individual disks appearing one beside the other. This variant, too, is mainly important for functional examinations where it is important that the images be provided at exactly the same moment, as in heart examinations. A variant of the method particularly convenient for this purpose may be one where the observation window is restricted in the phase direction, in the pulse sequence used, so that only the relevant area of each disk is imaged. This is effected in the case of a spin echo sequence by having either the excitation pulse or the refocusing pulse act as a disk-selective means in the direction of the phase coding gradient. In the extreme case, the number of selected disks may correspond to the number of phase-coding steps so that no phase-coding gradient is required at all and all phase coding for the 2DFT is effected through variation of the pulse phase.

I claim:

1. Method for the simultaneous measurement of spin resonance signals, in particular NMR signals, from layers located at different depths in a test volume comprising the steps of:

subjecting the test volume to a homogeneous magnetic field in a Z direction and to successive sequences of pulse-shaped gradient fields;

subjecting the test volume to multiple-component rf excitation pulses $P_n$, said excitation pulses being synchronized in time with the gradient fields and having n components $P_m$ for exciting, due to a respective frequency $W_m$ thereof, a spin resonance of the Larmor frequency $W_m$ in a defined layer m of the test volume, a variation in space of the Larmor frequency $W_m$ being effected in the Z direction by application of a layer-selective gradient, the individual components $P_m$ of the multiple-component rf excitation pulse $P_n$ being dephased relative to each other by a phase displacement $\phi_m$ which is varied from one sequence to a next by successive addition of a constant phase increment $\Delta\phi_m$ modulo 360° fixed individually for each individual component $P_m$;

applying a read gradient to the test volume in a direction perpendicular to the Z direction at least for a time of appearance of spin echo signal;

measuring the spin echo signal during a complete measuring cycle consisting of n or an integral multiple of n sequences; and subjecting the measured spin echo signal to Fourier transformation.

2. The method according to claim 1, wherein flow rates of a medium flowing through the test volume are measured in a layer-selective manner by means of a bipolar phase-coding gradient according to the Fourier Flow Method.

3. The method according to claim 2, further comprising the step of mapping a plurality of flow profiles in order to achieve a qualitative three-dimensional representation of the volume passed by the flowing medium.

4. The method according to claim 2 wherein the pulse-shaped gradient field sequences are in synchronism with an ECG cycle in a cine mode.

5. The method according to claim 3 wherein the pulse-shaped gradient field sequences are in synchronism with an ECG cycle in a cine mode.

6. The method according to claim 1, wherein the sequences are image-recording sequences according to a spin echo 2 DFT method, an observation window of each layer being restricted by an excitation or refocusing pulse, said excitation or refocusing pulse being disk-selective in a direction of a phase gradient.

7. The method according to claim 6 wherein the measurement is effected in a ECG triggered mode.

8. The method according to claim 6, wherein phase coding for 2 DFT image reconstruction is effected exclusively through phase modulation of the excitation pulses.

9. The method according to claim 7, wherein phase coding for 2 DFT image reconstruction is effected exclusively through phase modulation of the excitation pulses.

10. The method according to claim 1, wherein the sequences are image-recording sequences according to a gradient echo method.

* * * * *